United States Patent [19]

Takahashi et al.

[11] 4,251,690
[45] Feb. 17, 1981

[54] FREQUENCY-MODULATION STEREOPHONIC RECEIVER

[75] Inventors: Kunihisa Takahashi, Kawagoe; Kozo Suzuki, Saitama, both of Japan

[73] Assignee: Toko, Inc., Tokyo, Japan

[21] Appl. No.: 59,628

[22] Filed: Jul. 23, 1979

[30] Foreign Application Priority Data

Jul. 28, 1978 [JP] Japan .................. 53-103688[U]

[51] Int. Cl.³ ............................................... H04H 5/00
[52] U.S. Cl. ................................................. 179/1 GM
[58] Field of Search ............ 179/1 GM, 1 GD, 1 GE; 329/50, 167, 135; 455/218, 219

[56] References Cited

U.S. PATENT DOCUMENTS 4,194,087  3/1980  Sakaida .......................... 179/1 GM
4,198,543  4/1980  Schertz et al. .................. 179/1 GM Primary Examiner—Douglas W. Olms
Attorney, Agent, or Firm—Lowe, King, Price & Becker

[57] ABSTRACT

A control circuit of an FM stereophonic receiver includes two sets of symmetrically arranged transistor pairs which form a DC supply regulating circuit therein and are connected to respective constant current sources. The control circuit receives an output signal from an FM detector and controls the coupling of the FM detector output to different input terminals of a switching circuit of the FM demodulator in response to a DC control signal indicative of the level of a received broadcast signal. The switching circuit receives a train of switching pulses of 38 kHz as a switching signal to derive a stereophonic or monophonic audio signal from the controllably applied FM detector output. The DC supply regulating circuit serves to maintain the DC level applied to the input terminals of the switching circuit at a constant value at all times to reduce noise which might occur in the reproduced audio signal when the receiver is switched over between the stereophonic and monophonic modes.

3 Claims, 2 Drawing Figures

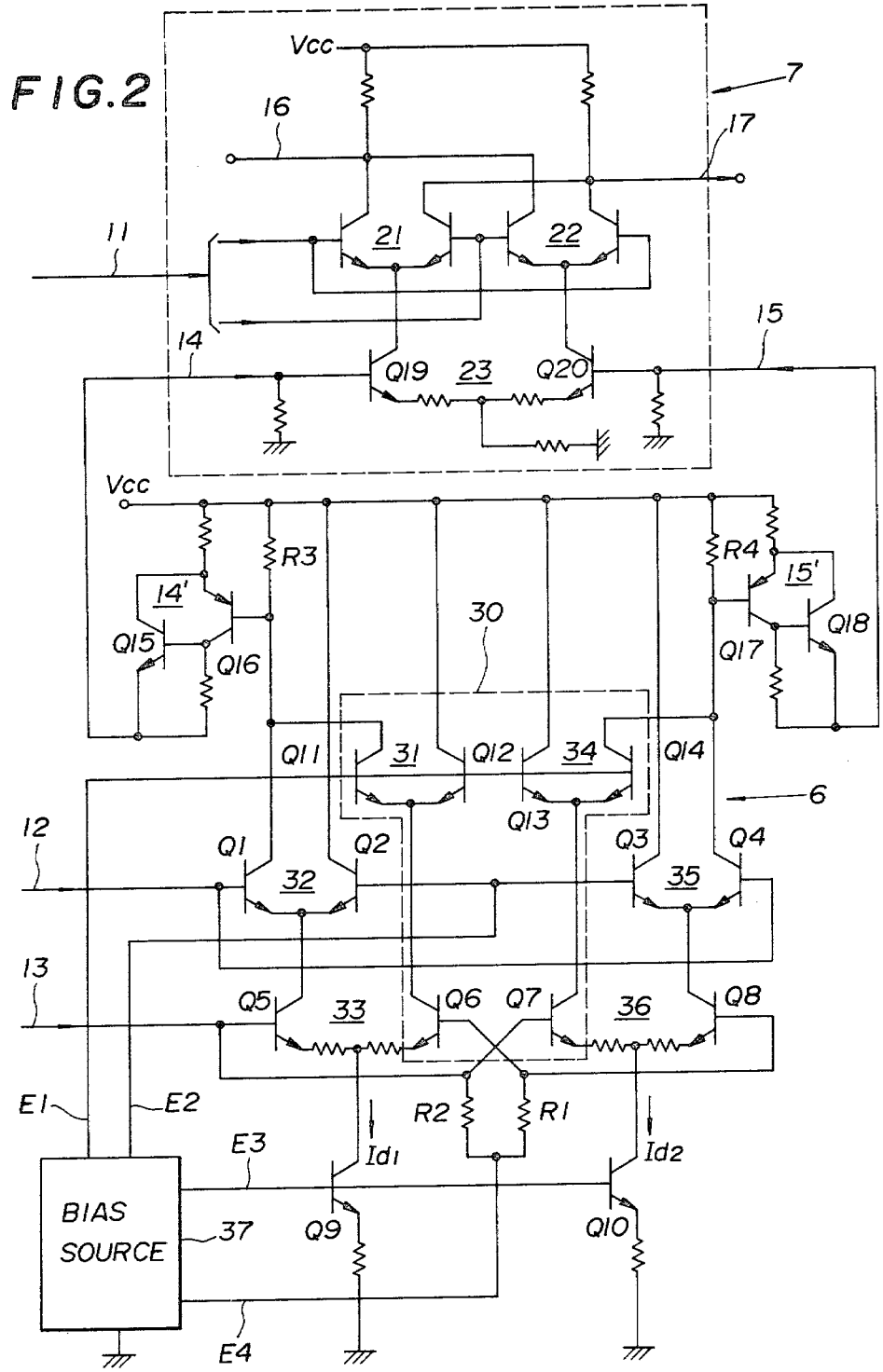

FREQUENCY-MODULATION STEREOPHONIC RECEIVER

BACKGROUND OF THE INVENTION

This invention relates to a frequency-modulation stereophonic receiver, and more particularly to an FM stereophonic receiver free from noticeable noise and distortion in reproduced audio output when automatically switched over between stereophonic and monophonic modes depending on variations in field strength of FM carrier wave to be received. This invention is particularly useful for automotive applications where the received broadcast signal is frequently subject to variations in field strength or signal level.

A problem heretofore encountered with the conventional stereophonic FM receivers, particularly mounted in automobiles, resides in the fact that frequent intensity variations in the received broadcast signal invariably results in insufficient channel separation with the attendant generation of uncomfortable noise in the audio output.

It is known that the signal-to-noise ratio of a received stereophonic FM signal is theoretically about 20 dB lower than that of monophonic FM signals and therefore stereophonic reproduction under poor receptivity would result conditions which tend to generate noise of a noticeable degree.

The conventional practice for reducing this noise problem is to automatically or manually switch over the receiver from the stereophonic reception mode to the monophonic when the receptivity is so poor that noise increases to a noticeable degree. However, such a system tends to produce crosstalk between the left and right channels upon the switchover and this results in distortion in audio output signals or so-called "pop" noise. This problem is considerable among others with the FM stereophonic receiver mounted in an automobile.

It is therefore a primary object of this invention to provide an FM stereophonic receiver which reduces noise when the receiver is switched over between stereophonic and monophonic modes in respnse to different levels of received broadcast signals.

It is another object of this invention to provide an FM stereophonic receiver having an improved FM demodulator for increasing signal-to-noise ratio under poor receptivity of FM stereophonic signal.

It is another object of this invention to provide an FM stereophonic receiver having an improved FM demodulator suitable for being manufactured by conventional integrated circuit technique.

Still another object of this invention is to provide an FM stereophonic receiver having an improved demodulator which maintains DC components, on which FM stereophonic composite signals are superimposed, at a constant level at all times for overcoming the aforementioned noise problem.

SUMMARY OF THE INVENTION

According to this invention, an FM stereophonic receiver adapted to receive broadcast signals and having a front end circuit, an intermediate-frequency (IF) stage, an FM detector and first means for generating a train of switching pulses in synchronism with said FM detector output, comprises:

second means for producing a direct-current control signal representative of the level of said received broadcast signal;

control means having first and second output terminals and receptive of both said DC control signal and said FM detector output for allowing said FM detector output to develop at said second output terminal, and controlling the intensity of said FM detector output developing at said first output terminal, between zero and the value equal to the intensity of said FM detector output at said first output terminal, in response to the magnitude of said DC control signal, and maintaining the DC potential at both said first and second output terminals at a constant level irrespective of the magnitude of said DC control signal; and switching means having first and second input terminals connected to said first and second output terminals respectively and receptive of said switching pulses for demodulating said FM detector output received from one or both of said first and second output terminals into stereophonic or monophonic signals in response to said switching pulses.

BRIEF DESCRIPTION OF THE DRAWINGS

The invention will be further described by way of example with reference to the accompanying drawings, in which like parts in each of the drawings are identified by the same reference characters, and in which:

FIG. 2 is a circuit diagram illustrating the details of the decoder and control circuit of FIG. 1.

DESCRIPTION OF THE PREFERRED EMBODIMENT

Figure 1:
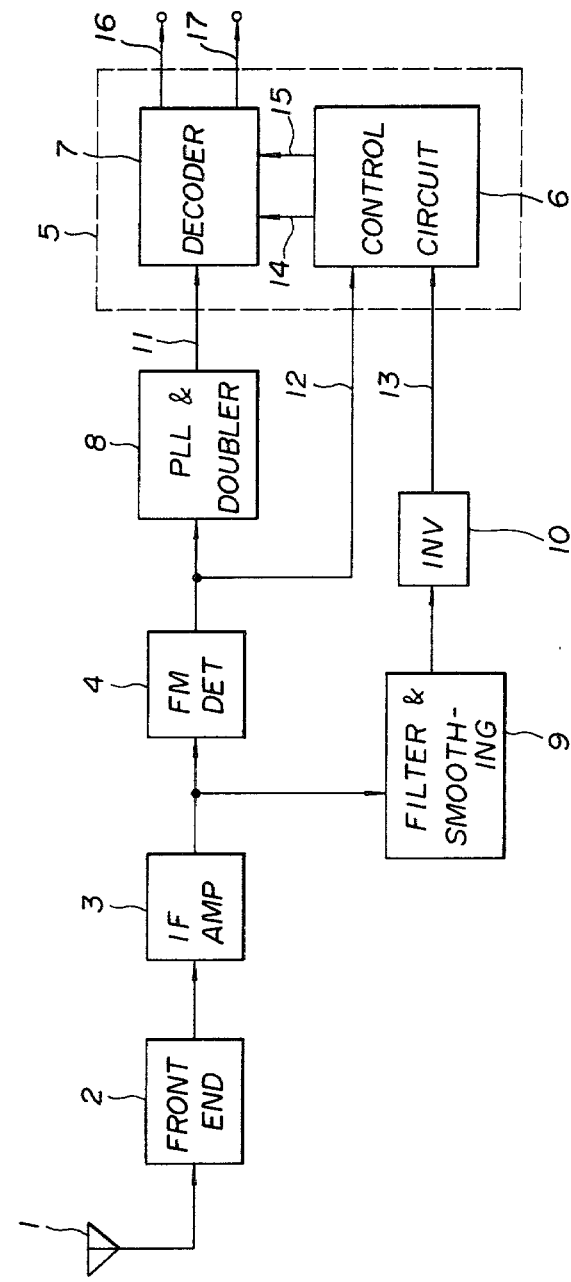
FIG. 1 is a schematic block diagram of the FM stereophonic receiver of the invention.

The FM stereophonic receiver of the invention as represented schematically in FIG. 1 comprises a front end circuit 2 which receives its input from an antenna 1 and supplies an intermediate frequency signal in conventional manner to an IF amplifier stage 3 and thence to an FM detector 4 of conventional design. The FM detector 4 supplies its output to a circuit 8 which conveniently comprises a PLL (phase-locked-loop), a 19 kHz oscillator and a frequency-doubler, and developes a train of switching pulses of 38 kHz and feeds it through line 11 to a switching circuit or FM decoder 7 which forms part of an FM demodulator 5. The FM detector output, which is a composite FM stereo signal, is also supplied through line 12 to a control circuit 6 of the FM demodulator 5 of the invention.

According to the invention, the control circuit 6 supplies the received composite FM signal through line 15 or both lines 14 and 15 to the decoder 7 depending on a DC control signal representative of the field strength of the signal received at the antenna 1 and at the same time maintains the DC level at the lines 14 and 15 at a constant value regardless of variations of the received signal intensity. The FM decoder 7 responds to the switching pulses from the circuit 8 developing stereophonic signals at output 16 and 17 when the composite FM signal is applied thereto exclusively through the line 15 and developing monophonic signals at the outputs 16 and 17 when the composite FM signals are applied thereto through both the lines 14 and 15. The decoded signals from the outputs 16 and 17 are then fed to a subsequent stage, not shown, of a conventional design.

For purposes of disclosure the DC control signal is derived through line 13 from a filter and smoothing circuit 9 which receives the IF signal from the IF amplifier stage 3 and generates a DC voltage whose value is proportional to the amplitude of the carrier component of the received broadcast signal. This DC voltage is then applied to an inverter 10 so that its output is an inverse function of the field intensity of the transmitted broadcast signal. As an alternative, the DC control signal can be obtained from driving currents for a field strength indicator by flowing them through a suitable circuit.

When the field intensity is above a certain level which permits satisfactory reproduction of stereophonic signals, the DC control signal at line 13 is below a preset value and the control circuit 6 steers the composite FM stereo signal exclusively to the output line 15. The FM decoder 7 performs switching action in response to the switching pulses from the circuit 8 to derive stereophonic signals which appear at the output terminals 16 and 17. However, as the field strength falls from the certain level, the DC control signal will increase and as a result the composite FM signal begins to appear at the line 14. If the field strength further falls such as to be insufficient to produce satisfactory stereophonic reproduction, the composite FM signal is then supplied through both the lines 14 and 15 to the FM decoder 7 which in turn causes a monophonic signal to appear at the terminals 16 and 17. In each of the above cases, the DC level at the lines 14 and 15 are maintained constant. Conversely, if the field strength increases from low level to high, the composite FM signal decreases at the line 14 and finally appears only at the line 15 with maintaining the constant DC voltage at both lines 14 and 15.

For complete understanding of the present invention, reference is now made to FIG. 2 in which details of the FM demodulator 5 of the invention are illustrated.

The control circuit 6 comprises a first set of first transistor pair 31, second transistor pair 32 and third transistor pair 33 connected between a voltage supply Vcc and ground through a first constant current source formed by a transistor Q9, and further comprises a second set of first transistor pair 34, second transistor pair 35 and third transistor pair 36 which are also connected between the voltage supply Vcc and ground through a second constant current source formed by a transistor Q10. Each of the transistor pairs of each set comprises a pair of transistors connected in a differential amplifier configuration. The transistor pairs of each set are connected in a symmetrical fashion with respect to the other. More specifically, the base electrodes of the transistors Q11, Q12, Q13 and Q14 of the first pairs 31 and 34 of each set are connected together to a bias terminal E1 of a bias source 37. The base electrodes of transistors Q2 and Q3 of the second pairs 32, 35 of each set are connected together to a bias terminal E2 and the base electrodes of transistors Q5 and Q7 of the third pairs 33, 36 of each set being connected together through resistor R2 to a bias terminal E4 of the bias source, and the base electrodes of transistors Q6 and Q8 of the third pairs of each set being connected together through resistor R1 to the bias terminal E4. The constant current source transistors Q9 and Q10 have their base electrodes connected together to a bias terminal E3 of the bias source 37.

The base electrodes of transistors Q1 and Q4 of the second pairs of each set are connected together to the line 12 to receive the composite signal from the FM detector 4 and the base electrodes of the transistors Q5 and Q7 are connected to the line 13 to receive the DC control signal applied thereto from the inverter 10 of FIG. 1. Transistors Q5 and Q6 of the third pair 33 of the first set have their collector-emitter paths of the second and first transistor pairs 32 and 31, respectively, of the first set, while transistors Q7 and Q8 of the third pair 36 of the second set have their collector-emitter paths connected in series with the collector-emitter paths of the first and second transistor pairs 34 and 35, respectively.

A DC supply regulating circuit 30 includes the transistors of the first pairs 31 and 34 of each set and the transistors Q6 and Q7 of the third pairs. When the received FM broadcast stereo signal is of a sufficient strength to permit stereophonic reproduction, the DC control voltage on line 13 is low such that the transistor Q6 allows a DC current $Id_1$ to flow therethrough and the transistor Q5 blockds a DC current from the first transistor pair of the first set and the transistor Q8 allows a DC current $Id_2$ to flow therethrough and the transistor Q7 blocks a DC current from the second transistor pair of the second set. In this case, each of DC collector currents of the transistors Q11 and Q12 is $Id_1/2$, and each of DC collector currents of the transistors Q3 and Q4 is $Id_2/2$. By virtue of the symmetrical circuit configuration, the DC currents $Id_1$ and $Id_2$ are of substantially equal values so that DC currents flowing through resistors R3 and R4 are $Id_1/2$ and $Id_2/2$, respectively, and are therefore substantially equal to each other. The DC currents through the resistors R3 and R4 are then amplified by Darlington Amplifier, viz., output circuits 14' and 15', respectively. The circuit 14' and 15' include transistors Q15–Q16, and Q17–Q18, respectively.

On the other hand, the FM detector output applied to the base of transistor Q4 causes a signal to be developed in the output circuit 15' while the FM detector output applied to the base of transistor Q1 is prevented from causing a signal to develop in the output circuit 14'.

When the received broadcast signal level is insufficient to produce satisfactory stereophonic reproduction, the DC control signal at the line 13 rises and the transistors Q5, Q6, Q1, Q2, Q11 and Q12 allow DC currents $Id_1/2$, $Id_1/2$, $Id_1/4$, $Id_1/4$, $Id_1/4$ and $Id_1/4$ to flow therethrough, respectively, while the transistors Q7, Q8, Q3, Q4, Q13 and Q14 allow DC currents $Id_2/2$, $Id_2/2$, $Id_2/4$, $Id_2/4$, $Id_2/4$ and $Id_2/4$ to flow therethrough, respectively. The DC currents flowing through the resistors R3 and R4 are therefore $Id_1/2$ and $Id_2/2$ just as in the aforementioned case. This is because the total current flow through the transistors Q9 and Q10 remains unchanged. Under these circumstances, the FM detector output applied to the base of the transistor Q1 is coupled to the output circuit 14', so that this FM detector output is superimposed on the DC component of the constant value and appears at the output line 14, while the DC superimposed FM detector output also appears at the output line 15 as previously described.

If the DC control signal at the line 13 is of a value defining a condition between the above two cases, the FM detector output superimposed on the DC component from the output circuit 14' is smaller as compared with the case where the received broadcast signal level is insufficient to produce satisfactory stereophonic reproduction. However, the DC currents flowing through the resistors R3 and R4 are maintained $Id_1/2$ and $Id_2/2$, respectively.

The DC current regulating circuit 30 serves to maintain the DC currents through the resistors R3 and R4 under the stereophonic and monophonic modes and also the intermediate condition therebetween.

The detector 7 comprises essentially a double-balanced differential amplifier formed by transistor pairs 21 and 22 which are coupled to ground by means of a transistor pair 23 formed by input transistors Q19 and Q20 whose base electrodes are connected to the output circuits 14' and 15', respectively, of the control circuit 6 and biased at a constant DC level supplied therefrom. The double-balanced differential amplifier receives the 38 kHz switching pulses through the input lines 11 as a switching gate signal to separate the respective channel signals from each other (i.e., stereophonic mode) when the received signal is high, or to combine the channel signals into a monophonic signal when the received signal level is low.

As previously described, when the received signal level is high to allow stereophonic reproduction, the FM detector output or composite signal appears exclusively on the output circuit 15', and then the signal fed to the transistor Q20 is separated into the left and right channels through the switching actions of the transistor pairs 21 and 22. The left and right channels appears at the output lines 16 and 17, respectively.

Conversely, when the received signal intensity is low, the composite FM signal appears on both output circuits 14' and 15' as described above and are coupled through transistors Q19 and Q20 to the switching transistor pairs 21 and 22, respectively. The result is a monophonic audio output of the combined left and right channel signals which appear both at the output lines 16 and 17. The FM receiver is thus automatically switched from the stereophonic mode to a monophonic mode or vice versa without causing DC level variations which would otherwise result in uncomfortable noise in reproduced audio signal. Therefore, the present invention ensures a distortionless audio output signal having a constant level DC component, on which the FM detector outputs are superimposed, in the presence of frequent switchover between different reproduction modes which occur as a result of variations in the level of the received broadcast stereophonic signal.

While a particular embodiment of this invention has been shown and described, it will be obvious to those skilled in the art that changes and modification may be made without departing from the invention in its broader aspects, and therefore, it is intended in the appended claims to cover all such modifications and changes as may fall within the true spirit and scope of the invention.

What is claimed is:

1. A frequency-modulation (FM) stereophonic receiver adapted to receive broadcast signals and having a front end circuit, an intermediate-frequency (IF) amplifier stage, an FM detector and first means for generating a train of switching pulses in synchronism with said FM detector output, comprising:

second means for producing a direct-current (DC) control signal representative of the level of said broadcast signal;

control means having a first and a second output terminals and receptive of both said DC control signal and said FM detector output for allowing said FM detector output to develop at said second output terminal at all times, and controlling the intensity of said FM detector output developing at said first output terminal, between zero and the value equal to the intensity of said FM detector output at said first output terminal, in response to the magnitude of said DC control signal, and maintaining the DC potential at both said first and second output terminals at a constant level irrespective of the magnitude of said DC control signal; and switching means having a first and a second input terminals connected to said first and second output terminals respectively and receptive of said switching pulses for demodulating said FM detector output received from one or both of said first and second output terminals into stereophonic or monophonic signals in response to said switching pulses.

2. An FM stereophonic receiver as claimed in claim 1, in which said control means comprises:

a first and a second sets of first, second and third transistor pairs each of which includes the transistors connected in a differential amplifier configuration, the transistor pairs of each set being arranged in a symmetrical circuit relation with respect to the other set, said first and second transistor pairs of each set being connected in a series circuit to the respective transistors of said third transistor pair;

a first and a second constant current source connected in series with said third transistor pairs of said first and second sets, respectively; and a first output circuit including said first output terminal and associated with said first transistor pair of said first set to develop a first output signal at said first output terminal and a second output circuit including said second output terminal and associated with said second transistor pair of said second set to develop a second output signal at said second output terminal;

the base electrodes of said second transistor pair of each set being receptive of said FM detector output and the base electrodes of said third transistor pair of each set being so connected to receive said DC control signal that, in response to a level exceeding a first level of said DC control signal, said first transistor pair of said first set and one transistor of said third transistor pair of said first set are rendered conductive to cause a first DC potential to develop at said first output terminal of said first output circuit and said second transistor pair of said second set and one transistor of said third transistor pair of said second set are rendered conductive to cause a second DC potential, which is substantially equal to said first DC output potential, to develop at said second output terminal of said second output circuit and causes said FM detector output to develop at said second output terminal, and, in response to a second level of said DC control signal, all transistors of said first and second sets are rendered conductive so as to cause said first and second DC potential to develop at said first and second output terminals respectively and causes said FM detector output to develop at said first output terminal in addition to said second output terminal, and, in response to a level between said first and second levels of said DC control signal, said first set controls the intensity of said FM detector output developing at said first output terminal while maintaining said first and second DC potential at said first and second output terminals, respectively.

3. An FM stereophonic receiver as claimed in claim 2, in which said switching means comprises a first and a second input transistors having their base electrodes connected to said first and second output terminals of said control means respectively and having their emitters connected through respective resistors to ground, a fourth and a fifth transistor pairs each comprising a pair of first and second switching transistors connected in a differential amplifier configuration with the emitters of said fourth transistor pair being connected together to the collector of said first input transistor and the emitters of said fifth transistor pair being connected together to the collector of said second input transistors, the base electrodes of said first switching transistors of each pair being connected together to receive said switching pulses of a first polarity and the base electrodes of said second switching transistors of each pair being connected together to receive said switching pulses of a second polarity, the collectors of the first switching transistor of said first pair and the second switching transistor of the second pair being connected together to a first output terminal of said switching means and the collectors of said first switching transistor of the second pair and the second switching transistor of the first pair being connected together to a second output terminal of said switching means.

* * * * *